United States Patent [19]

Suzuki

[11] Patent Number: 5,494,844

[45] Date of Patent: Feb. 27, 1996

[54] PROCESS OF FABRICATING BI-CMOS INTEGRATED CIRCUIT DEVICE

[75] Inventor: Hisamitsu Suzuki, Tokyo, Japan

[73] Assignee: NEC Corporation, Tokyo, Japan

[21] Appl. No.: 257,529

[22] Filed: Jun. 9, 1994

[30] Foreign Application Priority Data

Jun. 14, 1993 [JP] Japan .................................. 5-141911

[51] Int. Cl.⁶ ........................ H01L 21/70; H01L 27/00; H01L 21/44

[52] U.S. Cl. ........................ 437/59; 437/192; 437/193; 437/200

[58] Field of Search ............................. 437/31, 203, 59, 437/193, 192, 200

[56] References Cited

U.S. PATENT DOCUMENTS

| | | | |
|---|---|---|---|
| 4,906,593 | 5/1990 | Shioya et al. | 148/DIG. 26 |
| 5,047,367 | 9/1991 | Wei et al. | 148/DIG. 147 |
| 5,057,455 | 10/1991 | Foo et al. | 437/193 |
| 5,075,241 | 12/1991 | Spratt et al. | 435/31 |

FOREIGN PATENT DOCUMENTS

1-147843  6/1989  Japan .

4-58525  2/1992  Japan .

OTHER PUBLICATIONS

K. Nakamura et al., "A 6ns 4Mb ECL I/O BiCMOS SRAM with LV–TTL Mask Option," Reprinted from ISSCC92 Digest of Technical Papers, vol. thirty–five, Feb., 1992, 92CH3128-6, Mar. 1992, 1992 IEEE.

T. Maeda et al,. "High Performance BiCMOS Technology Design for sub–10ns 4Mbit BiCMOS SRAM with 3.3V Operation," 1992 Symposium on VLSI Technology Digest of Technical Papers, 92CH3172-4/92/0000-0032, 1992 IEEE.

*Primary Examiner*—George Fourson
*Assistant Examiner*—Brian K. Dutton
*Attorney, Agent, or Firm*—Burns, Doane, Swecker & Mathis

[57] ABSTRACT

A process of fabricating a bi-CMOS integrated circuit device has a step of selectively growing doped polysilicon over a source/drain region and a part of base region exposed to contact holes formed in a silicon oxide layer without residue of the doped polysilicon on the silicon oxide layer, thereby preventing the bi-CMOS integrated circuit device from undesirable short circuit.

4 Claims, 14 Drawing Sheets

5,494,844

PROCESS OF FABRICATING BI-CMOS INTEGRATED CIRCUIT DEVICE

FIELD OF THE INVENTION

This invention relates to a process of fabricating a semiconductor integrated circuit device and, more particularly, to a process of fabricating a bi-CMOS integrated circuit device.

DESCRIPTION OF THE RELATED ART

A bipolar transistor achieves a high-speed switching action, and drives a large amount of current. On the other hand, a series of field effect transistors opposite in channel conductivity type is known as a complementary transistor, and is operable with a small amount of electric power consumption. The bipolar transistors and the complementary transistors are integrated on a single semiconductor substrate, and an integrated circuit of compromise is known as a bi-CMOS integrated circuit. The bi-CMOS integrated circuit is available for a high-speed low-power consumption memory device or a high-speed low-power consumption logic circuit, by way of example.

FIGS. 1A to 1C illustrate a typical example of the prior art process sequence for fabricating a static random access memory device of the bi-CMOS implementation disclosed in 1992 Symposium on VLSI Technology Digest of Technical Papers, pages 32 and 33, and the prior art wiring technology is applied to the static random access memory device. Two-level wirings are incorporated in the prior art static random access memory device, and each two-level wiring has a lower layer of a refractory metal silicide and an upper layer of doped polysilicon. The two-level structure is called as a "polyside".

The prior art process sequence starts with preparation of a p-type silicon substrate 1, and heavily doped p-type buried layers 1a and 1b and heavily-doped n-type buried layers 1c and 1d are formed in the p-type silicon substrate 1. An n-type epitaxial layer 2 is grown to 0.8 micron to 2.0 microns, and p-type wells 3a and 3b are formed in the n-type epitaxial layer 2. A thick field oxide layer 4 is selectively grown to 2500 to 6000 angstroms thick in the surface portion for defining active areas therein, and an heavily-doped n-type collector contact region 5 is formed in the n-type epitaxial layer 2. The heavily-doped n-type collector contact region 5 is merged into the heavily-doped buried layer 1d.

Oxide films are thermally grown on the surface portions of the active areas assigned to MOS transistors, respectively, and partially serve as gate oxide films 6a, 6b and 6c. A lower layer of a refractory metal silicide and an upper layer of doped polysilicon are deposited and patterned so that polyside gate electrode 7a, 7b and 7c of 1000 to 4000 angstroms thick are laminated on the gate oxide films 6a, 6b and 6c, respectively.

Lightly-doped n-type impurity regions 8, lightly-doped p-type impurity regions 9, heavily-doped n-type impurity regions 10, heavily-doped p-type impurity regions 11, a base intrinsic region 12 and an extrinsic base contact region 13 are selectively formed in the p-type well 3a and the n-type epitaxial layer 2 through respective lithographic stages, and side walls 14 are formed on the side surfaces of the polyside gate electrodes 7a to 7c between the formation of the lightly-doped impurity regions 8 and 9 and the heavily-doped impurity regions 10 and 11. The resultant structure is illustrated in FIG. 1A.

Subsequently, a silicon oxide layer 15 is deposited to 500 to 3000 angstroms thick over the entire surface of the structure through a chemical vapor deposition, and a ground contact hole 16a and an emitter contact hole 16b are formed in the silicon oxide layer 15 through the lithographic techniques.

A phosphorus or arsenic-doped polysilicon layer is deposited to 500 to 3000 angstroms thick through a chemical vapor deposition, and the doped polysilicon layer is covered with a refractory metal silicide layer of 500 to 2000 angstroms thick. The n-type impurity may be doped in the polysilicon through an ion-implantation or a diffusion. An appropriate mask is patterned on the refractory metal silicide layer, and the refractory metal silicide layer and the doped polysilicon layer are anisotropically etched so as to pattern a ground voltage line 17 and an emitter electrode 18. The ground voltage line 17 and the emitter electrode 18 are formed in the polyside structure, and are held in contact through the contact holes 16a and 16b with the heavily-doped n-type region 10 and the base intrinsic region 12, respectively. The polysilicon layer of the polyside structure may be doped with the n-type impurity after the formation of the polyside structure. The resultant structure is illustrated in FIG. 1B.

A silicon oxide layer 19 is deposited over the entire surface of the structure to 500 to 3000 angstroms thick by using the chemical vapor deposition technique, and a contact hole (not shown) is formed in the silicon oxide layer 19 over the polyside gate electrode 7c by using an anisotropical etching technique.

A polysilicon layer is deposited to 500 to 3000 angstroms thick over the entire surface of the structure through the chemical vapor deposition, and is patterned into highly resistive polysilicon strips 20.

A silicon oxide layer 21 is deposited to 500 to 3000 angstroms thick over the entire surface of the structure, and contact holes are formed by using the anisotropic etching technique. The contact holes pass through the silicon oxide layers 15, 19 and 21, and expose the impurity regions 11, the extrinsic base region 13, the emitter electrode 18 and the collector contact region 5. An aluminum layer is sputtered to 3000 to 10000 angstroms thick over the entire surface of the structure, and is patterned into metal wiring strips 22. An emitter region 23 is formed through one of the heat treatments before the patterning stages for the wirings or through a heat treatment added to the above described sequence before the patterning stages for the wirings. The resultant structure is illustrated in FIG. 1C.

The prior art bi-CMOS integrated circuit device is fabricated through another process sequence. Early stages of the second process sequence are similar to the early stages of the first process sequence until the resultant structure shown in FIG. 1A, and are not described for avoiding repetition.

After the formation of the heavily-doped impurity regions 10 and 11, a silicon oxide layer 21 is deposited to 500 to 3000 angstroms thick over the entire surface of the structure through the chemical vapor deposition, and a ground contact hole 22 is formed in the silicon oxide layer 21 by using the lithographic techniques and the anisotropical etching technique. A silicide layer 23 is deposited over the entire surface of the structure to 500 to 2000 angstroms thick, and n-type impurity such as phosphorus or arsenic is introduced. Using a mask (not shown), the silicide layer is anisotropically etched away for forming a ground voltage line 23 as shown in FIG. 2A.

Subsequently, a silicon oxide layer 24 is deposited to 500 to 3000 angstroms thick over the entire surface of the structure by using the chemical vapor deposition, and a contact hole (not shown) is formed in the silicon oxide layer 24 over the polyside gate electrode 7c by using the anisotropic etching technique.

A polysilicon layer is deposited to 500 to 3000 angstroms thick over the entire surface of the structure by using the chemical vapor deposition technique, and is patterned into highly resistive polysilicon strips 25. A silicon oxide layer 26 is deposited over the entire surface of the structure, and an n-type doped polysilicon layer is deposited to 500 to 3000 angstroms thick over the silicon oxide layer 26. The n-type doped polysilicon layer may be doped with phosphorus or arsenic atoms. The n-type dopant impurity may be doped through an ion-implantation or a diffusion after the deposition. The n-type polysilicon layer is patterned into an emitter electrode 27 by using the lithographic techniques and the anisotropic etching technique. The resultant structure is illustrated in FIG. 2B.

After the formation of the emitter electrode 27, a silicon oxide layer 28 is deposited to 2000 to 10000 angstroms thick over the entire surface of the structure by using the chemical vapor deposition, and contact holes are formed through the lithographic techniques and the anisotropic etching technique. An aluminum layer is sputtered to 3000 to 10000 angstroms over the entire surface of the silicon oxide layer 28, and is patterned into metal wiring strips 29. An emitter region 30 is formed in one of the heat treatments before the wiring stages or in an additional heat treatment stage before the wiring stages. The resultant structure is illustrated in FIG. 2C.

The first prior art process sequence concurrently forms the ground voltage line 17 and the emitter electrode 18 in the polyside structure, and the concurrent patterning decreases the lithographic/etching stages forming parts of the first prior art process sequence. However, in order to decrease the resistance along the conduction path in the polyside structure, it is necessary to increase the thickness of the polyside structure, and steps ranging between 1000 angstroms and 5000 angstroms take place in the inter-level silicon oxide layer 19. As a result, such wide steps do not allow an aligner to clearly focus the mask pattern on the polysilicon layer, and the polysilicon layer is hardly patterned into fine highly resistive polysilicon strips 20. The poor step coverage similarly affects the patterning stage of the metal wiring strips 22.

On the other hand, the second prior art process sequence patterns the ground voltage line 23 and the emitter electrode 27 from the silicide layer and the doped polysilicon layer through the different lithographic/etching stages, and the ground voltage line 23 and appropriate dimensions are given to the ground voltage line 23 and the emitter electrode 27. Since the silicide effectively decreases the resistance of the wirings rather than the polyside structure, the minimum supply voltage is lowered rather than the polyside structure by 0.6–1.0 volt. If static memory cells are incorporated in the bi-CMOS integrated circuit device, the minimum supply voltage level ranges 2.4 volts to 2.6 volts, and the bi-CMOS integrated circuit device is stable under an external power voltage at 3.3 volts. However, the second prior art process sequence is rather complex than the first prior art process sequence. Moreover, the emitter contact hole is large in aspect ratio, because the emitter contact hole passes the three silicon oxide layers 21, 24 and 26. For this reason, the emitter electrode 27 is resistive against the emitter current, and the resistance is 10–30 ohms higher than that of the bi-CMOS integrated circuit device fabricated through the first prior art process sequence.

Japanese Patent Publication of Unexamined Application No. 1-147843 teaches how to cope with a large aspect ratio. According to the Japanese Patent Publication of Unexamined Application, a wiring is patterned after plugging a conductive substance into the contact hole.

In detail, if MOS transistors 41/42 or 43/44 are arranged in a narrow area such as a ground contact area or a digit contact area as shown in FIG. 3A, the MOS transistors 41 and 43 are close to the adjacent MOS transistors 42 and 44, and deep valleys 45 take place between the MOS transistors 41 and 42 and between the MOS transistors 43 and 44. A silicon oxide layer 46 is deposited over the entire surface of the structure, and contact holes (not shown) are formed in the silicon oxide layer 46. Subsequently, a polysilicon or doped polysilicon layer 47 is further deposited to 2000–50000 angstroms thick over the entire surface of the silicon oxide layer 46 as shown in FIG. 3B. The polysilicon/doped polysilicon layer 47 is uniformly etched away through an isotropical etching, and the residual polysilicon pieces plug the contact holes. Although the piece of polysilicon 47a improves the aspect ratio, the residual polysilicon piece 47b is left in the deep valley 45 as shown in FIG. 3C, and is causative of undesirable short circuit. For this reason, the plugging technique disclosed in the Japanese Patent Publication of Unexamined Application is effective against the contact holes with a large aspect ration; however, the residual polysilicon piece deteriorates the production yield.

SUMMARY OF THE INVENTION

It is therefore an important object of the present invention to provide a process of fabricating a bi-CMOS integrated circuit device which is simple and free from undesirable short circuit due to a residual polysilicon piece.

To accomplish the object, the present invention proposes to Selectively grow a conductive substance in contact hole or holes exposing impurity region or regions.

In accordance with the present invention, there is provided a process of fabricating an integrated circuit device, comprising the steps of: a) preparing a semiconductor substrate structure; b) forming at least one first active area of a first conductivity type and at least second and third active areas of a second conductivity type opposite to the first conductivity type in a surface portion of the semiconductor substrate structure; c) forming at least one first field effect transistor of a first channel conductivity type, at least one second field effect transistor of a second channel conductivity type opposite to the first channel conductivity type and collector and base regions of at least one bipolar transistor in the first active area, the second active area and the third active area, respectively; d) covering the first field effect transistor, the second field effect transistor and the collector and base regions with an insulating layer; e) forming a first contact hole exposing a part of the base region in the insulating layer; f) growing a first conductive layer of a predetermined substance from the part of the base region for filling the first contact hole without a residue of the predetermined substance left on the first insulating layer; g) depositing a silicide layer on the entire surface of the structure of the step f); h) forming a second conductive layer from the silicide layer, the second conductive layer being held in contact with the first conductive layer for serving as an emitter electrode; and i) completing the integrated circuit device, and having a sub-step of diffusing a dopant impurity from the first conductive layer into the part of the base region for forming an emitter region of the bipolar transistor.

BRIEF DESCRIPTION OF THE DRAWINGS

The feature and advantages of the process according to the present invention will be more clearly understood from the following description taken in conjunction with the accompanying drawings in which.

DESCRIPTION OF THE PREFERRED EMBODIMENTS

First Embodiment

Figure 1A:
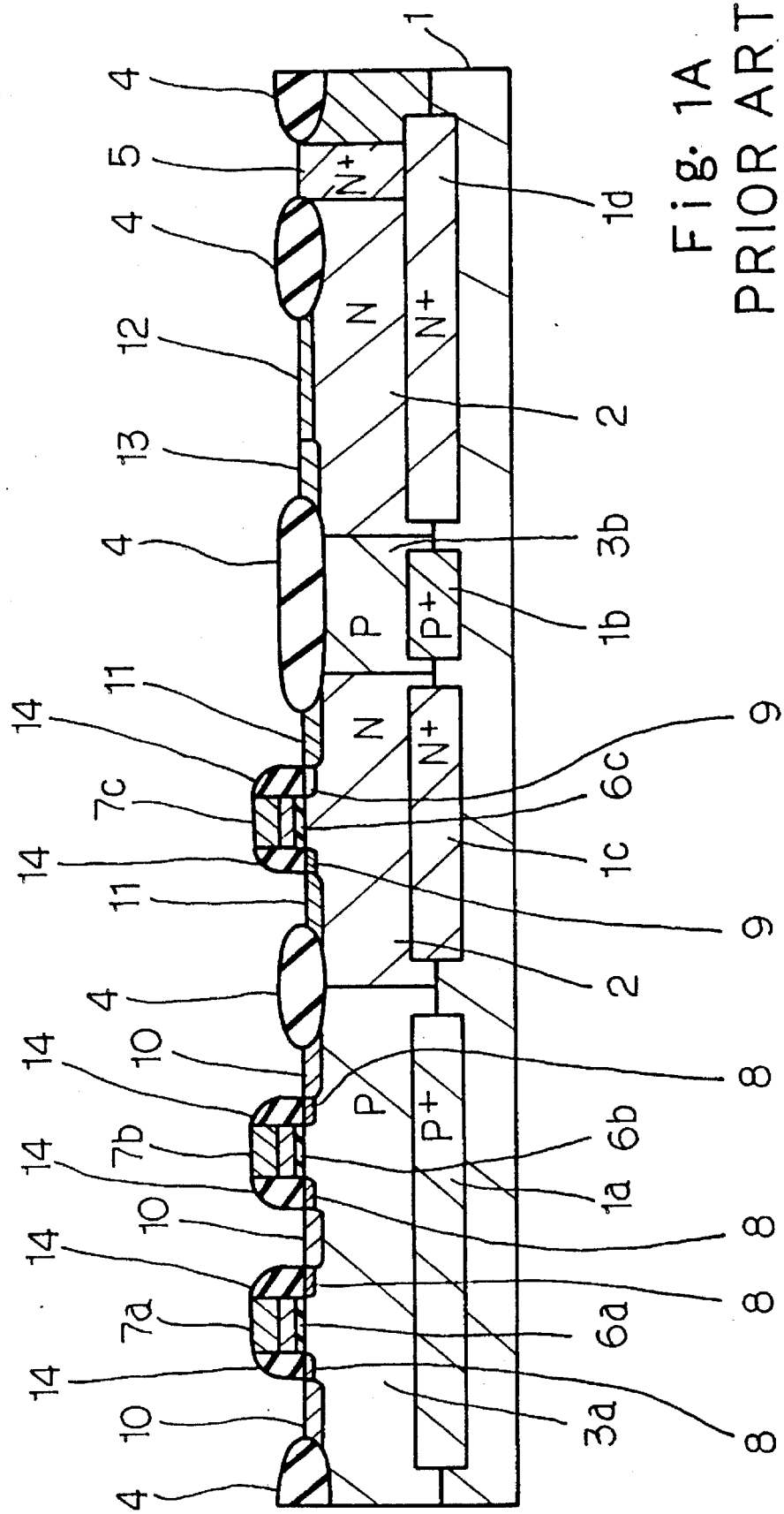
FIGS. 1A to 1C are cross sectional views showing the first prior art process sequence for fabricating the bi-CMOS integrated circuit device.
Figure 1B:
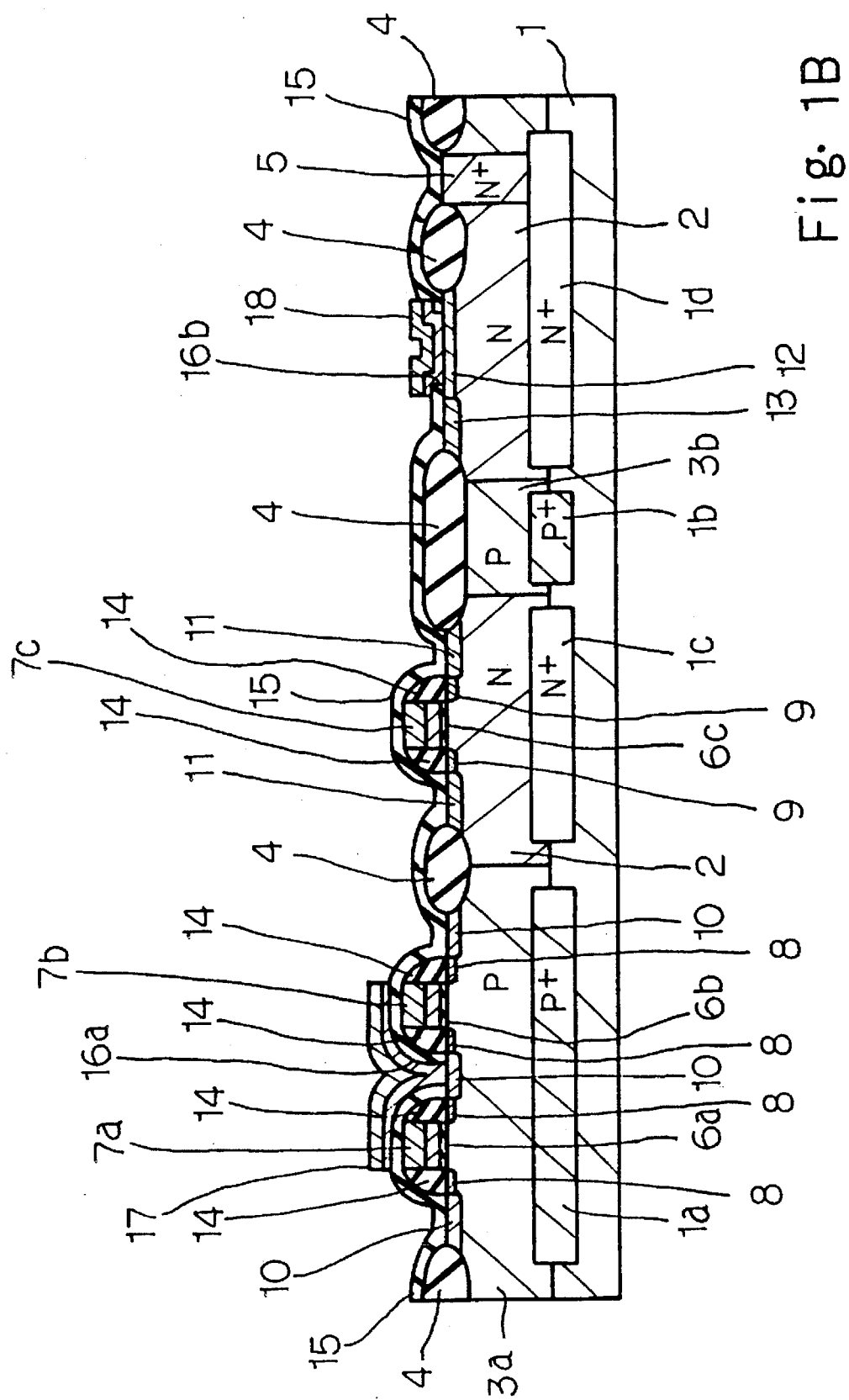
Figure 1C:
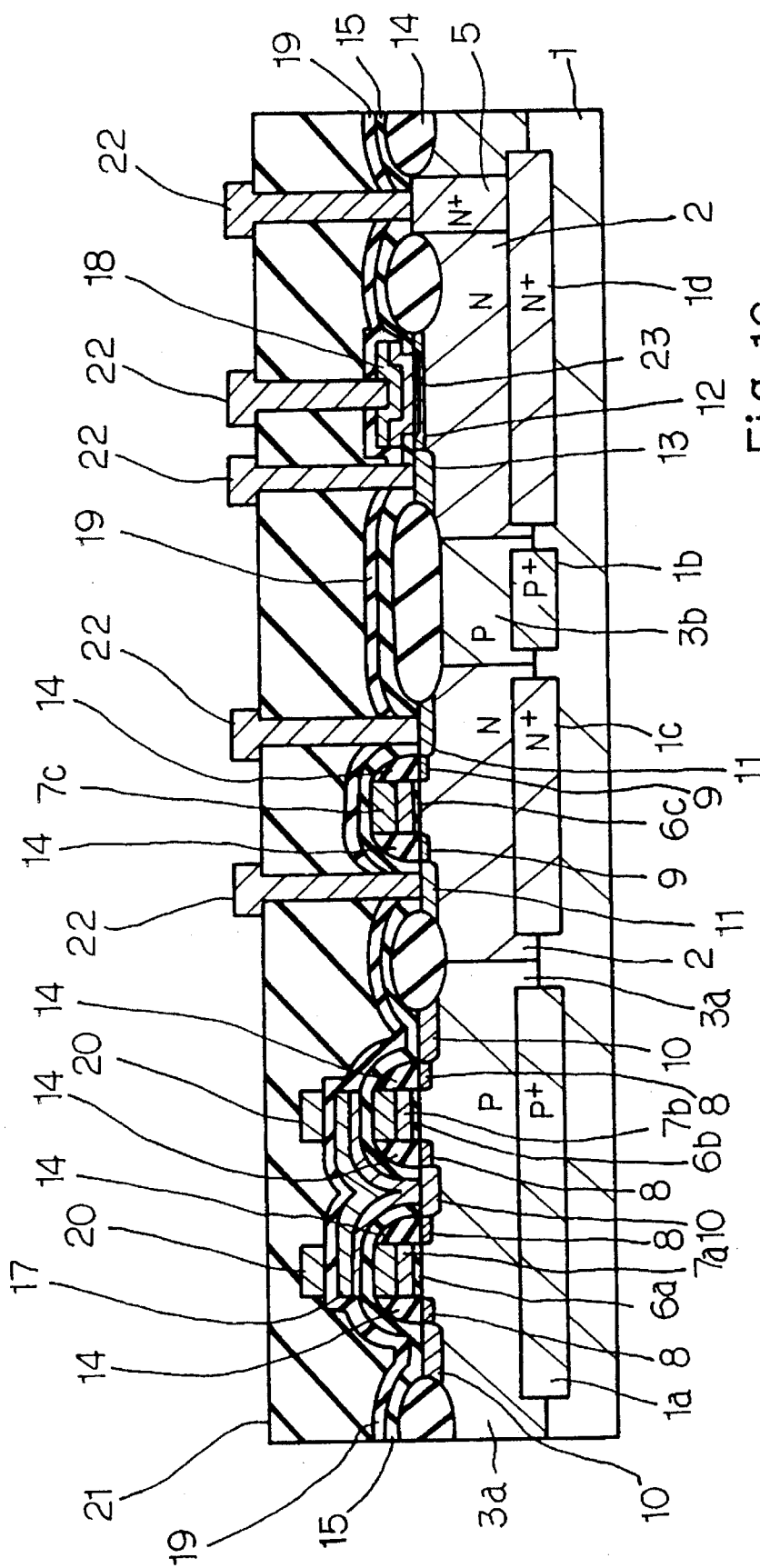
Figure 2A:
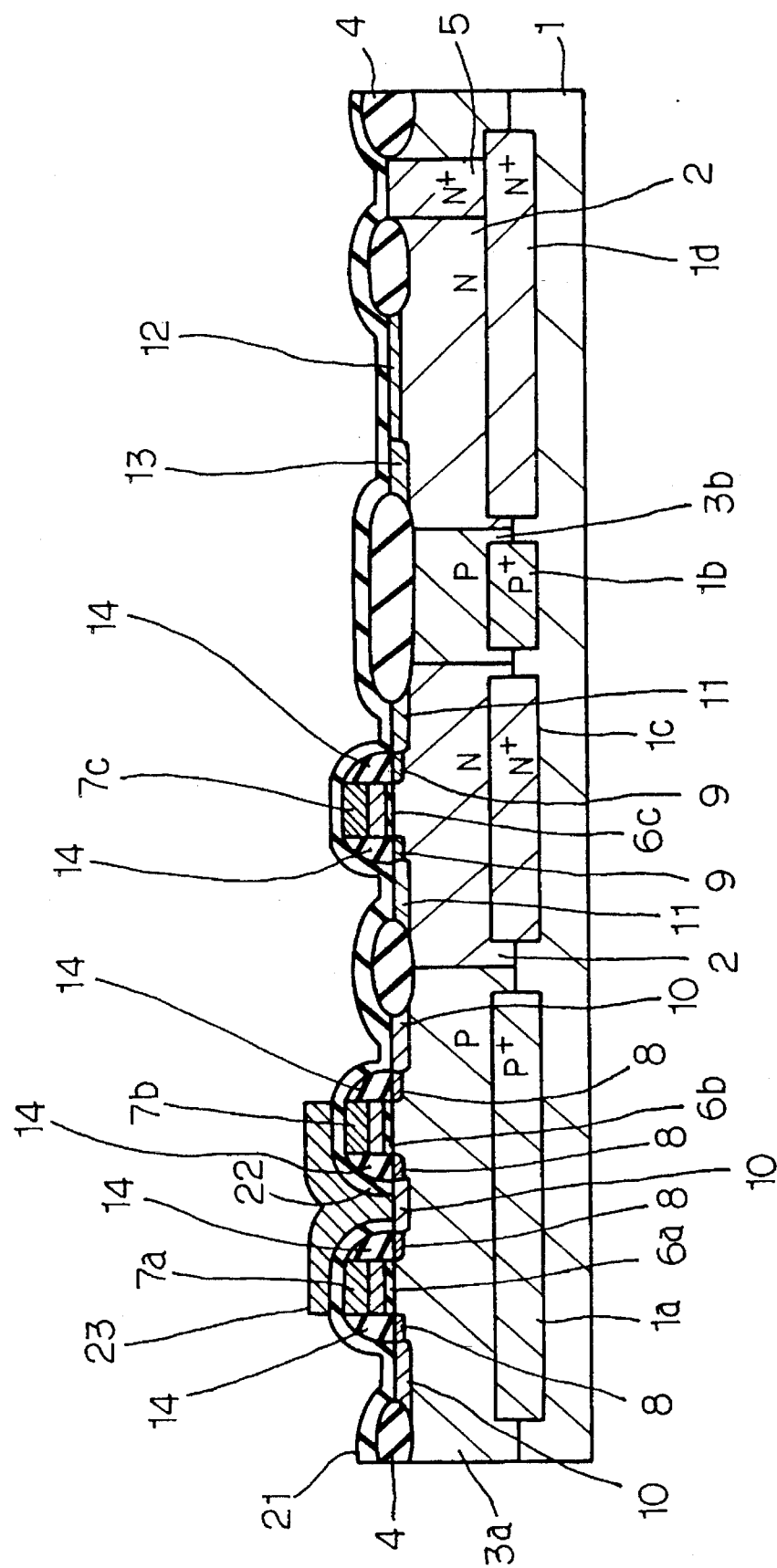
FIGS. 2A to 2C are cross sectional views showing the later stages of the second prior art process sequence for fabricating the bi-CMOS integrated circuit device.
Figure 2B:
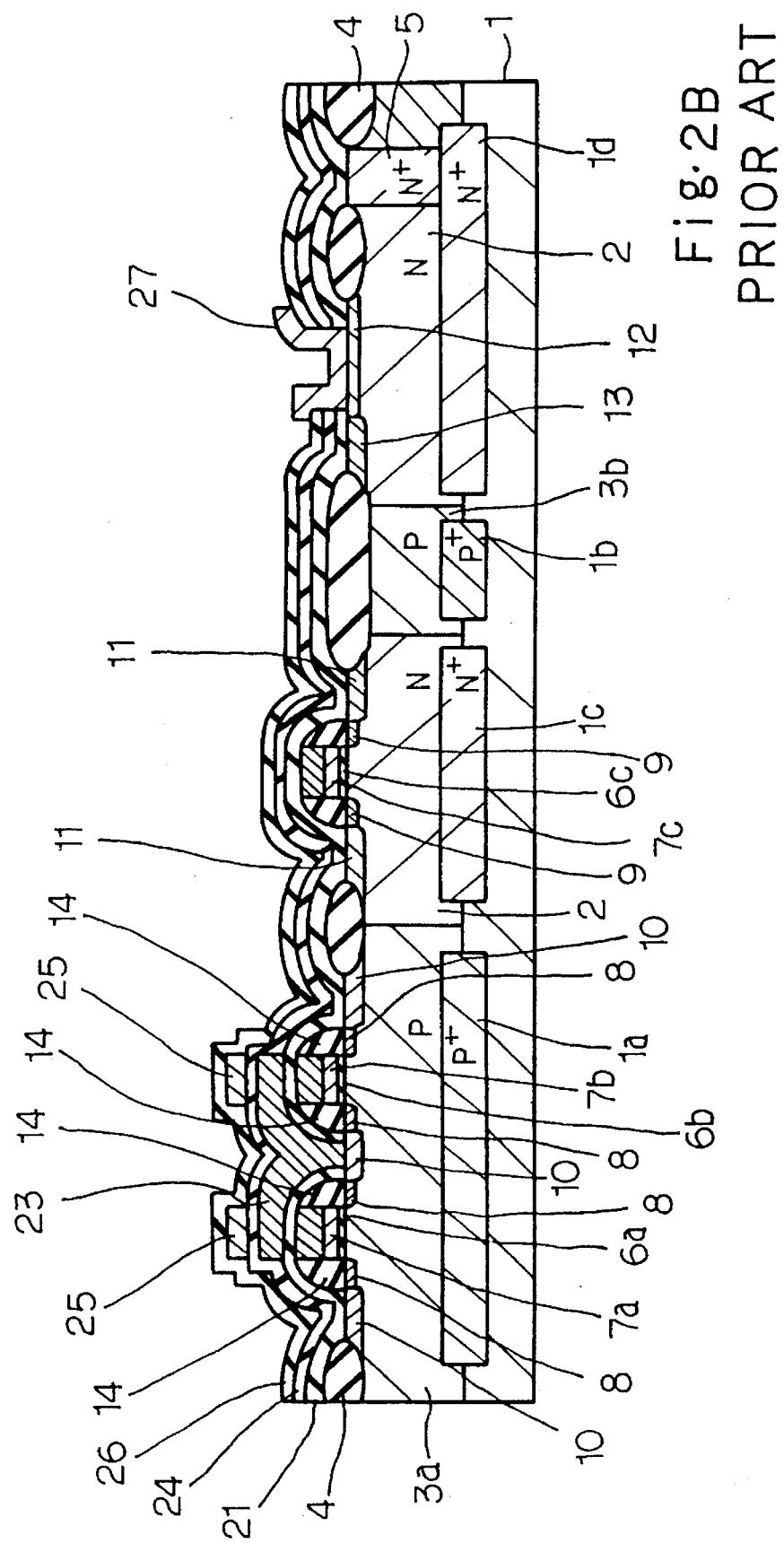
Figure 2C:
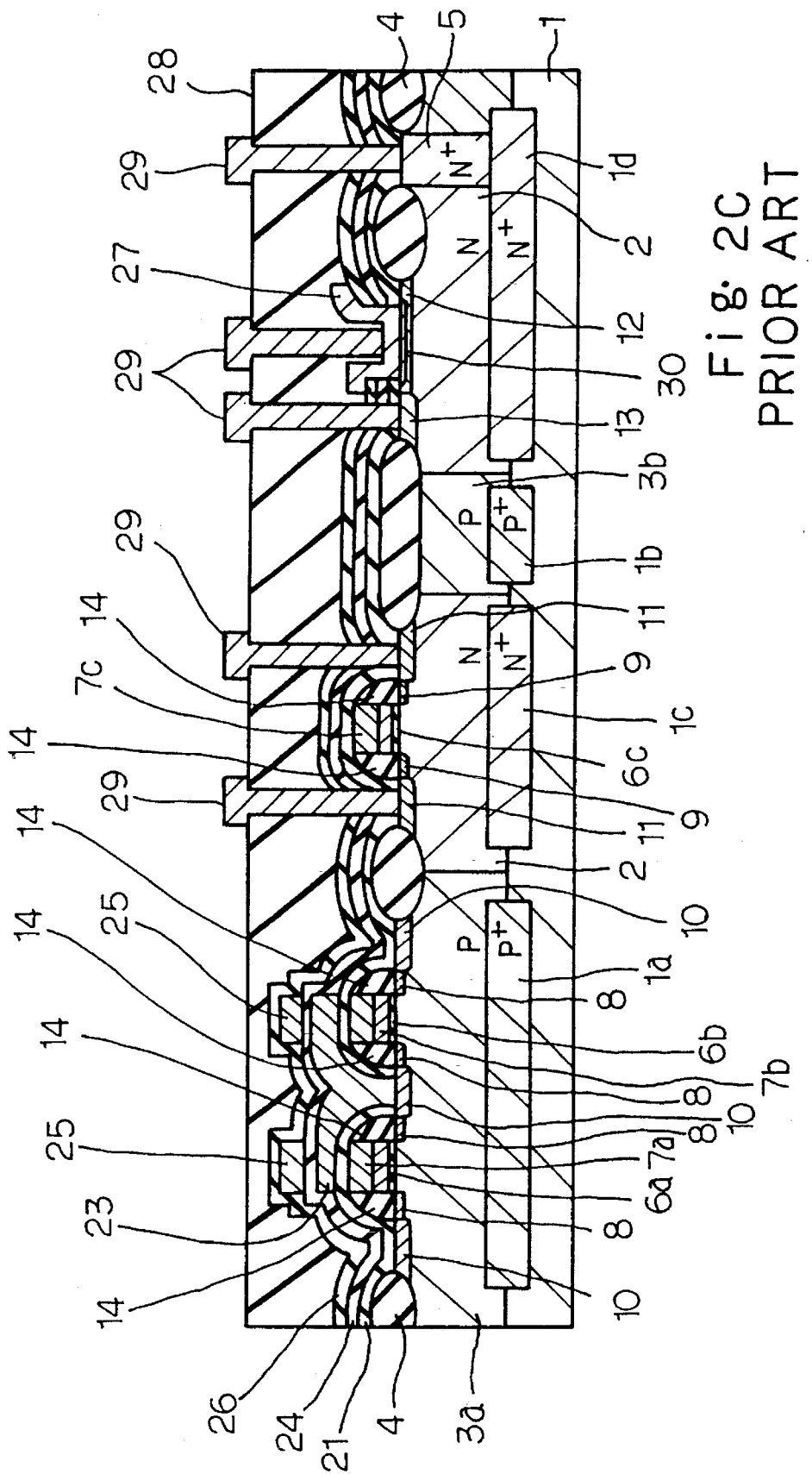
Figure 3A:
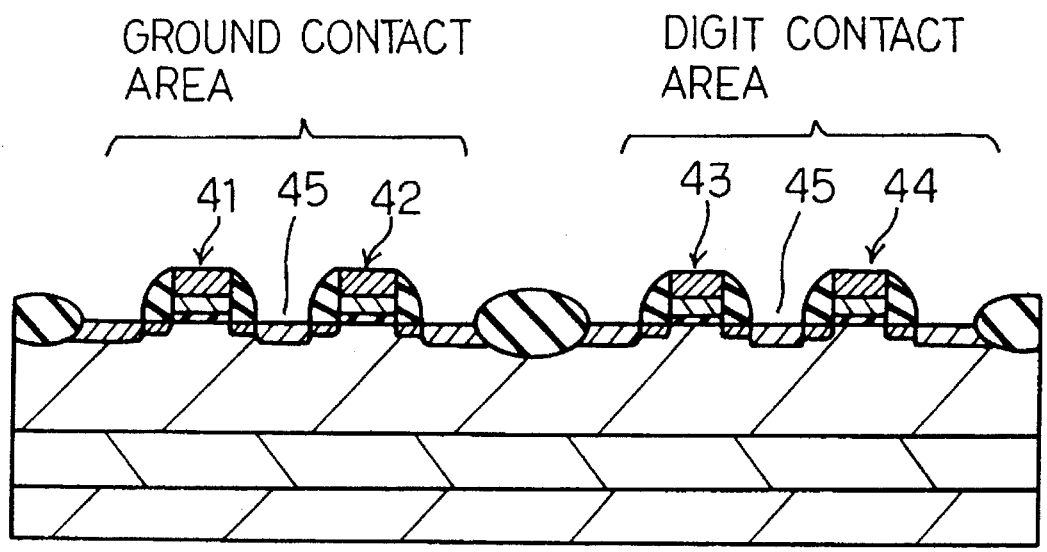
FIGS. 3A to 3C are cross sectional views showing the third prior art process sequence.
Figure 3B:
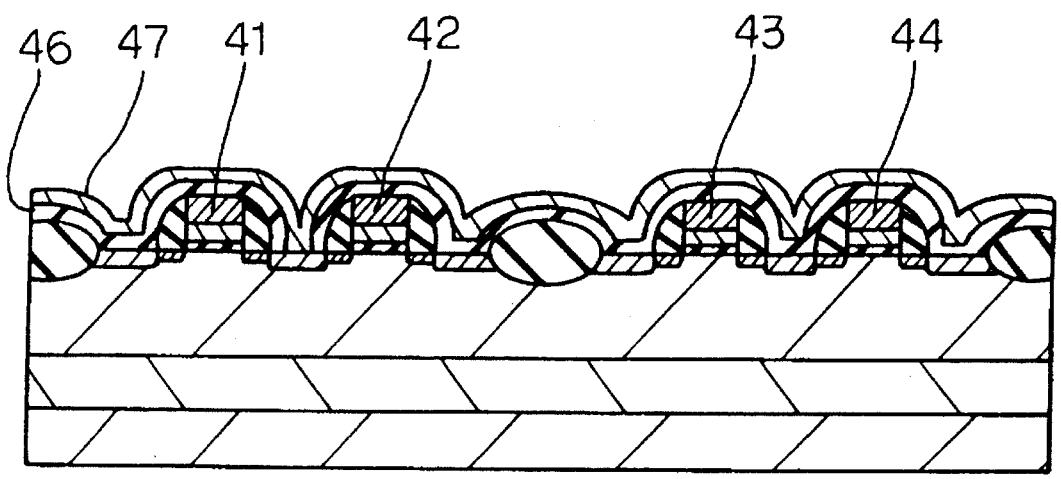
Figure 3C:
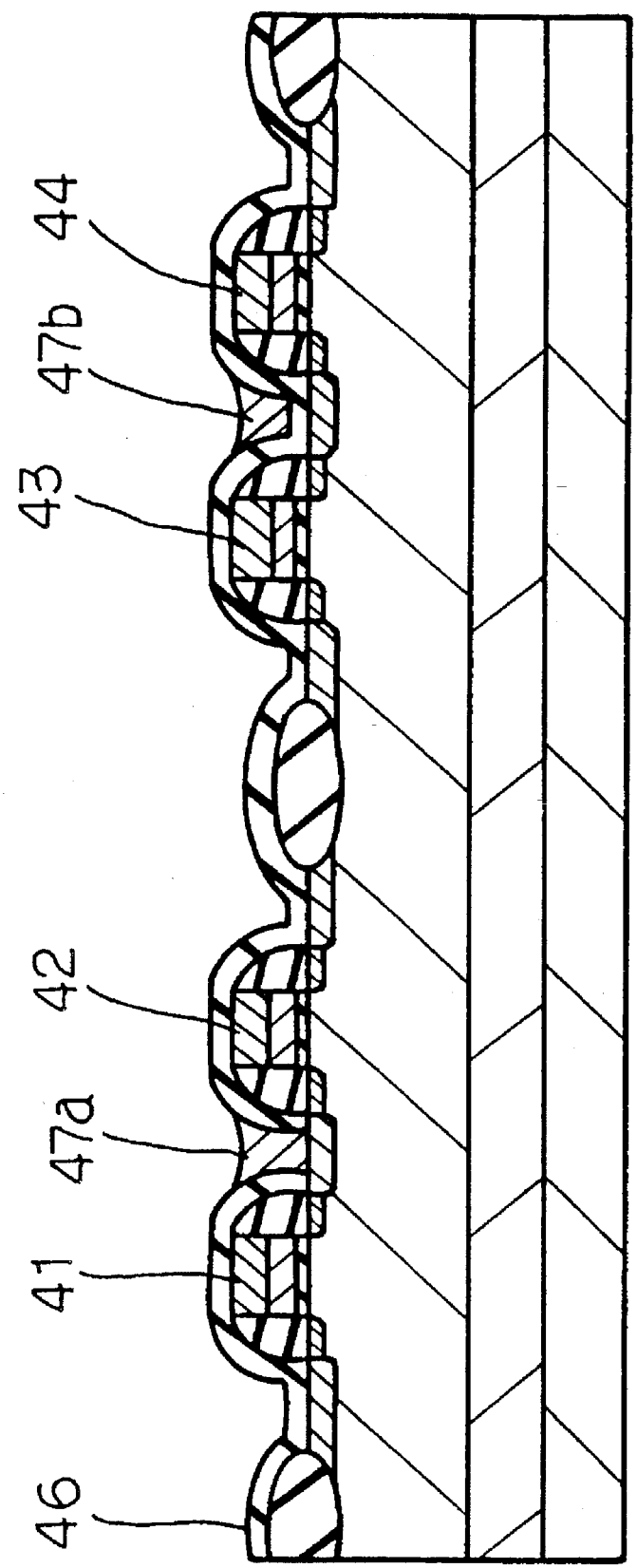
Figure 4A:
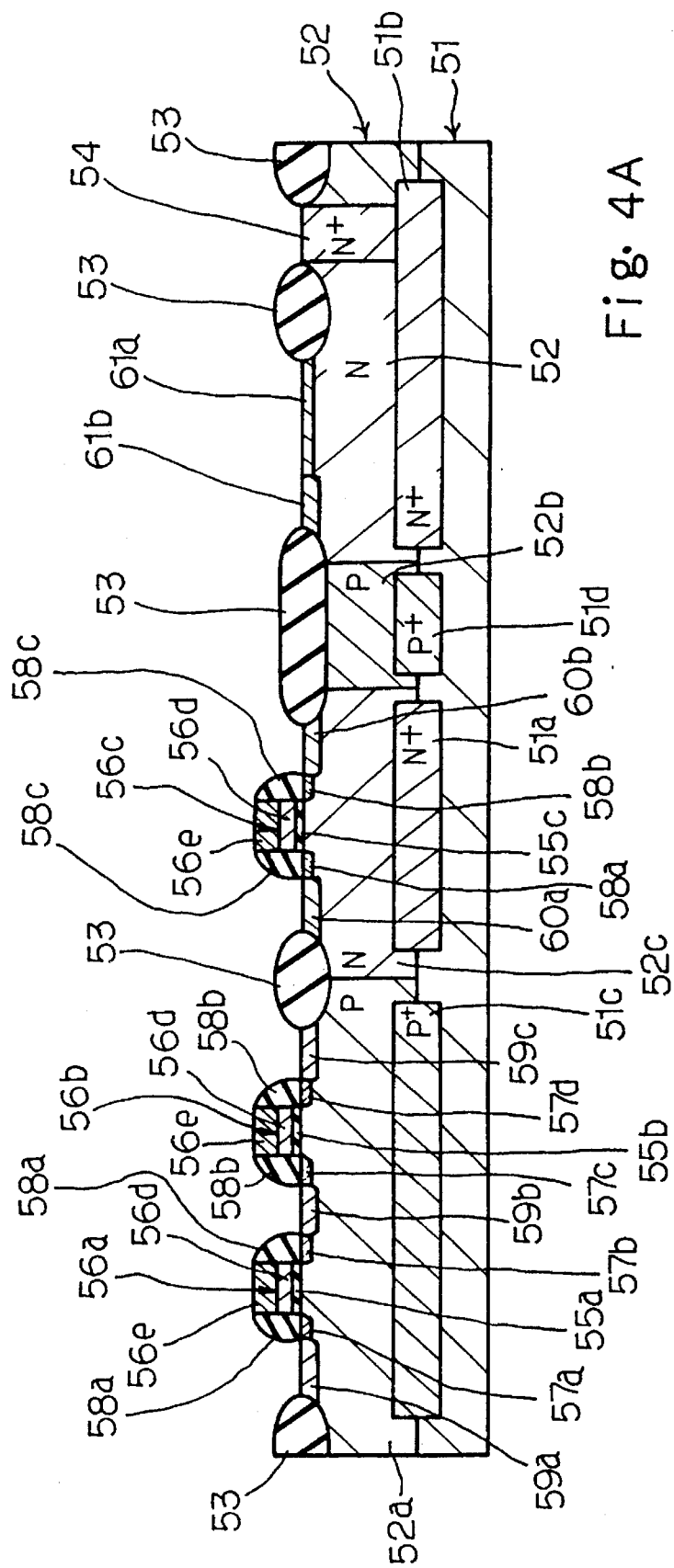
FIGS. 4A to 4C are cross sectional views showing a process sequence according to the present invention.
Figure 4B:
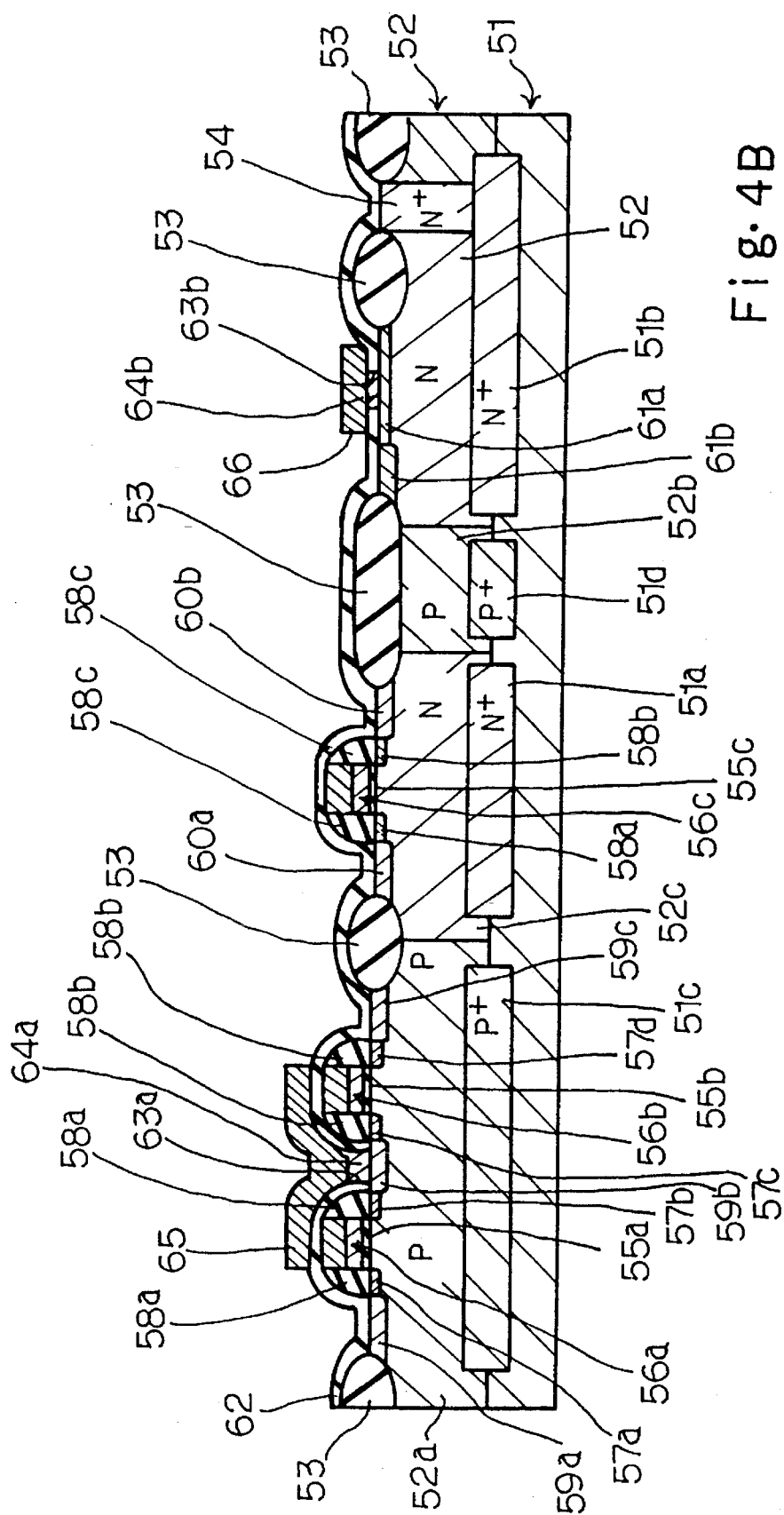
Figure 4C:
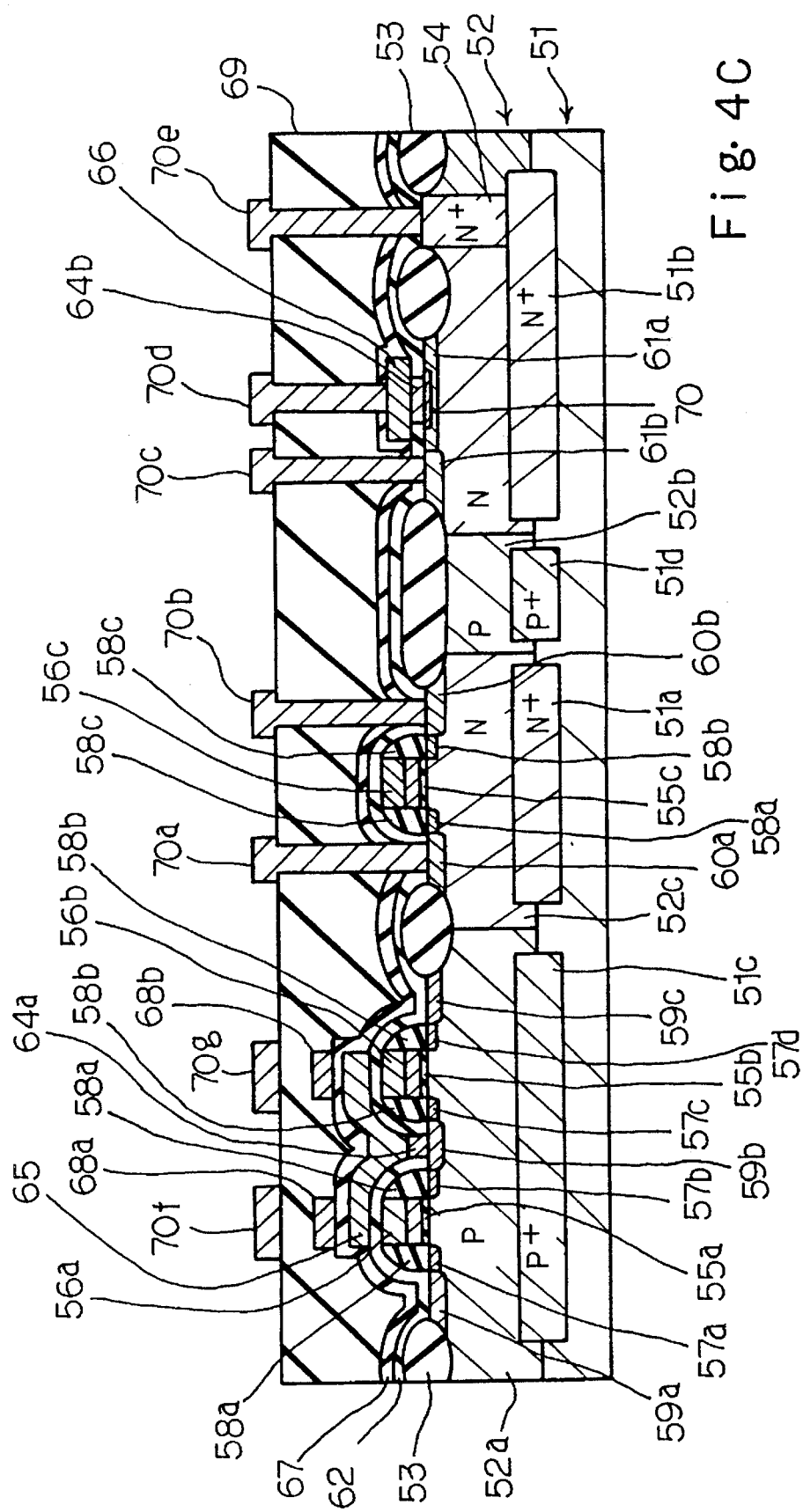

Referring to FIG. 4A to 4C of the drawings, a process embodying the present invention starts with preparation of a p-type silicon substrate 51, and heavily-doped n-type buried layers 51a and 51b and heavily-doped p-type buried layers 51c and 51d are formed in the surface portion of the lightly-doped p-type silicon substrate 51 at spacings.

An n-type epitaxial layer 52 is epitaxially grown to 0.8–2.0 microns thick, and p-type wells 52a and 52b and an n-type well 52c are formed in the n-type epitaxial layer 52 over the heavily-doped p-type buried layers 51c and 51d and the heavily-doped n-type buried layer 51a, respectively. The p-type silicon substrate 51 and the n-type epitaxial layer 52 form in combination a semiconductor substrate structure.

A thick field oxide layer 53 is selectively grown to 2500–6000 angstroms thick in the surface portion of the semiconductor substrate structure, and active areas are defined by the thick field oxide layer 53. In this instance, the active area on the left side is assigned to n-channel enhancement-type field effect transistors, the active area on the right side is assigned to a bipolar transistor, and the active area therebetween is assigned to a p-channel enhancement type field effect transistor. The p-channel enhancement type field effect transistor forms a complementary transistor together with one of the n-channel enhancement type field effect transistors.

N-type dopant impurity is introduced into the n-type epitaxial layer 52 for forming a heavily-doped collector contact region 54, and the heavily-doped collector contact region 54 is held in contact with the heavily-doped n-type buried layer 51b.

The semiconductor substrate structure is placed in oxidation atmosphere, and thin silicon oxide films are thermally grown on the active areas, respectively. The thin silicon oxide films on the active areas assigned to the field effect transistors partially serve as gate oxide layers 55a, 55b and 55c.

A polysilicon layer is deposited over the entire surface of the structure, and is covered with a silicide layer. The laminated structure of the polysilicon layer and the silicide layer is patterned into gate structures 56a, 56b and 56c by using lithographic techniques. The gate structures 56a to 56c are 1000–4000 angstroms thick, and each gate structure has a lower polysilicon layer 56d and an upper silicide layer 56e.

N-type dopant impurity is introduced into the p-type well 52a, and lightly-doped n-type source/drain regions 57a, 57b, 57c and 57d are formed in the p-type well 52a in a self-aligned manner with the gate structures 56a and 56b. P-type dopant impurity is introduced into the n-type well 52c, and lightly-doped p-type source/drain regions 57a and 57b are formed in the n-type well 52c in a self-aligned manner with the gate structure 56c.

Silicon oxide is deposited over the entire surface of the structure, and is partially etched away so as to leave side walls 58a, 58b and 58c on both sides of the gate structures 56a to 56c. N-type dopant impurity is introduced in the p-type well 52a, and heavily-doped n-type source/drain regions 59a, 59b and 59c are formed in the p-type well 52a in a self-aligned manner with the side walls 58a and 58b. The heavily-doped n-type source/drain regions 59a and 59c are contiguous to the lightly-doped n-type source/drain regions 57a and 57d, respectively, and the heavily-doped n-type source/drain region 59b is contiguous to the lightly-doped n-type source/drain regions 57b and 57c. P-type dopant impurty is introduced into the n-type well 52c, and heavily-doped p-type source/drain regions 60a and 60b are formed in the n-type well 52c in a self-aligned manner with the side walls 58c. The heavily-doped p-type source/drain regions 60a and 60b are contiguous to the lightly-doped n-type source/drain regions 58a and 58b.

P-type dopant impurity is introudced into the n-type epitaxial layer 52 for forming a p-type base intrinsic region 61a, and a heavily-doped p-type extrinsic base region 61b is further formed in the n-type epitaxial layer 52. The heavily-doped p-type extrinsic base region 61b is contiguous to the p-type base intrinsic region 61a. The resultant structure is illustrated in FIG. 4A.

A silicon oxide layer 62 is deposited to 500–3000 angstroms thick over the entire surface of the structure through a chemical vapor deposition, and an appropriate mask (not shown) is patterned on the silicon oxide layer 62 by using lithographic techniques. The mask exposes the silicon oxide layer 62 over the heavily-doped n-type source/drain region 59b and an emitter forming region in the p-type base intrinsic region 61a. Using the mask, the exposed silicon oxide layer 62 is anisotropically etched away, and a ground via 63a and an emitter via 63b are formed in the silicon oxide layer 62.

Polysilicon films 64a and 64b are grown to 500–3000 angstroms thick on the exposed heavily-doped n-type source/drain region 59b and the exposed p-type base intrinsic region 61a, respectively. The selective growth of the polysilicon films 64a and 64b is, by way of example, disclosed in Japanese Patent Publication of Unexamined Application No. 4-58525.

In the selectively growing stage, reactant gases and an etching gas are concurrently introduced in a reaction chamber, and flow over the intermediate structure. Polysilicon grows over the heavily-doped n-type source/drain regions 59b and the p-type base intrinsic region 61a. However, a small amount of polysilicon is undesirably deposited on the silicon oxide layer 62, and only the etching gas is introduced in the reaction chamber for removing the polysilicon on the silicon oxide layer 62. The introduction of both reactant and etching gasses and the introduction of the etching gas are alternately carried out for selectively growing the polysilicon in the heavily-doped n-type source/drain region 59b and the p-type base intrinsic region 61b without residue of polysilicon on the silicon oxide layer 62. N-type impurity such as phosphorus or arsenic is doped into the polysilicon films 64a and 64b during the selective growth of polysilicon, or is introduced therein through a thermal diffusion after the selective growth.

Subsequently, a silicide layer is deposited to 500–2000 angstroms over the entire surface of the structure, and phosphorus or arsenic is introduced into the silicide layer. An appropriate mask is patterned on the silicide layer, and the exposed silicide layer is anisotropically etched away for forming a ground voltage line 65 and an emitter electrode 66. The resultant structure is illustrated in FIG. 4B.

A silicon oxide layer 67 is deposited over the entire surface of the structure, and a polysilicon layer is deposited over the silicon oxide layer 67. The polysilicon layer is patterned into resistive elements 68a and 68b. A silicon oxide layer 69 is deposited over the entire surface of the structure, and contact holes are formed in the silicon oxide layer 69 for exposing the heavily-doped source/drain regions 60a and 60b, the p-type extrinsic base region 61b, the emitter electrode 66 and the corrector contact region 54. An aluminum layer is sputtered over the entire surface of the structure, and passes through the contact holes so as to be held in contact with the exposed regions and the exposed electrode. An appropriate mask is patterned on the aluminum layer, and the aluminum layer is patterned into metal wirings 70a, 70b, 70c, 70d, 70e, 70f and 70g. Since the emitter electrode 66 is wider than the polysilicon film 64b, and allows the metal wirings 70c and 70d to extend in a space relation.

After the formation of the n-type doped polysilicon films 64b, heat application is repeated, and the n-type dopant impurity is diffused into the p-type base intrinsic region 61a in one of the heat applications for forming an emitter region 70. On the other hand, a heat treatment may be carried out for the emitter region 70. The resultant structure is illustrated in FIG. 4C.

The n-channel enhancement type field effect transistors, the p-channel enhancement type field effect transistor and the bipolar transistor thus fabricated are incorporated in the integrated circuit device, and the integrated circuit device may serve as a static type random access memory device. The n-type doped polysilicon films 64a and 64b form ohmic contacts for the ground voltage line 65 and the emitter electrode 66, respectively, and are provided between the heavily doped n-type source/drain region 59a/the n-type emitter region 70 and the ground voltage line 65/the emitter electrode 66. No residue of polysilicon is left between the silicon oxide layers 62 and 67.

As will be appreciated from the foregoing description, the ground voltage line 65 and the emitter electrode 66 are simultaneously patterned, and the process sequence according to the present invention is simpler than the first prior art process sequence. The plugging stage of the contact holes 63a and 63b does not leave residue of the polysilicon on the silicon oxide layer 62, and the bi-CMOS integrated circuit device fabricated through the process sequence is free from undesirable short-circuit.

Moreover, the ground voltage line 65 forms a step ranging between 500 angstroms and 2000 angstroms only, because the doped polysilicon film 64a is left in the contact hole 63a only. As a result, the step-coverage of the silicon oxide layer 67 is rather smooth, the mask pattern is exactly transferred to the silicide layer in the patterning stage for the ground voltage line 65. In other words, the focus margin is rather small.

The ground voltage line 65 on the silicon oxide layer 67 is implemented by the silicide strip only, and the resistance along the ground voltage line 65 is small. This means that the integrated circuit according to the present invention is operable at a power voltage 2.4–2.6 volts, and a relatively low external power voltage such as, for example 3.3 volts is available.

Second Embodiment

Another process sequence embodying the present invention is similar to the process sequence implementing the first embodiment until heavily/lightly doped impurity regions are formed in the semiconductor substrate structure. For this reason, the silicon substrate, the epitaxial layer, the buried layers, the heavily/lightly doped impurity regions, the gate oxide films, the gate electrodes, the thick field oxide layer, the gate electrodes and the side walls are labeled with references designating the corresponding layers and regions formed in the process sequence implementing the first embodiment.

After the formation of the impurty regions, a silicon oxide layer 81 is deposited to 500–3000 angstroms thick over the entire surface through the chemical vapor deposition, and a mask (not shown) is provided on the silicon oxide layer 81. The mask exposes a part of the silicon oxide layer 81 over an emitter forming region in the p-type base intrinsic region 61a. Using the mask, the silicon oxide layer 81 is partially etched away by using an anisotropical etching technique, and an emitter contact hole is formed in the silicon oxide layer 81. A polysilicon film 82a is selectively grown to 500–3000 angstroms on the emitter forming region through the selective growing technique disclosed in Japanese Patent Publication of Unexamined Application No. 4-58525. The mask is stripped off from the structure.

Figure 5A:
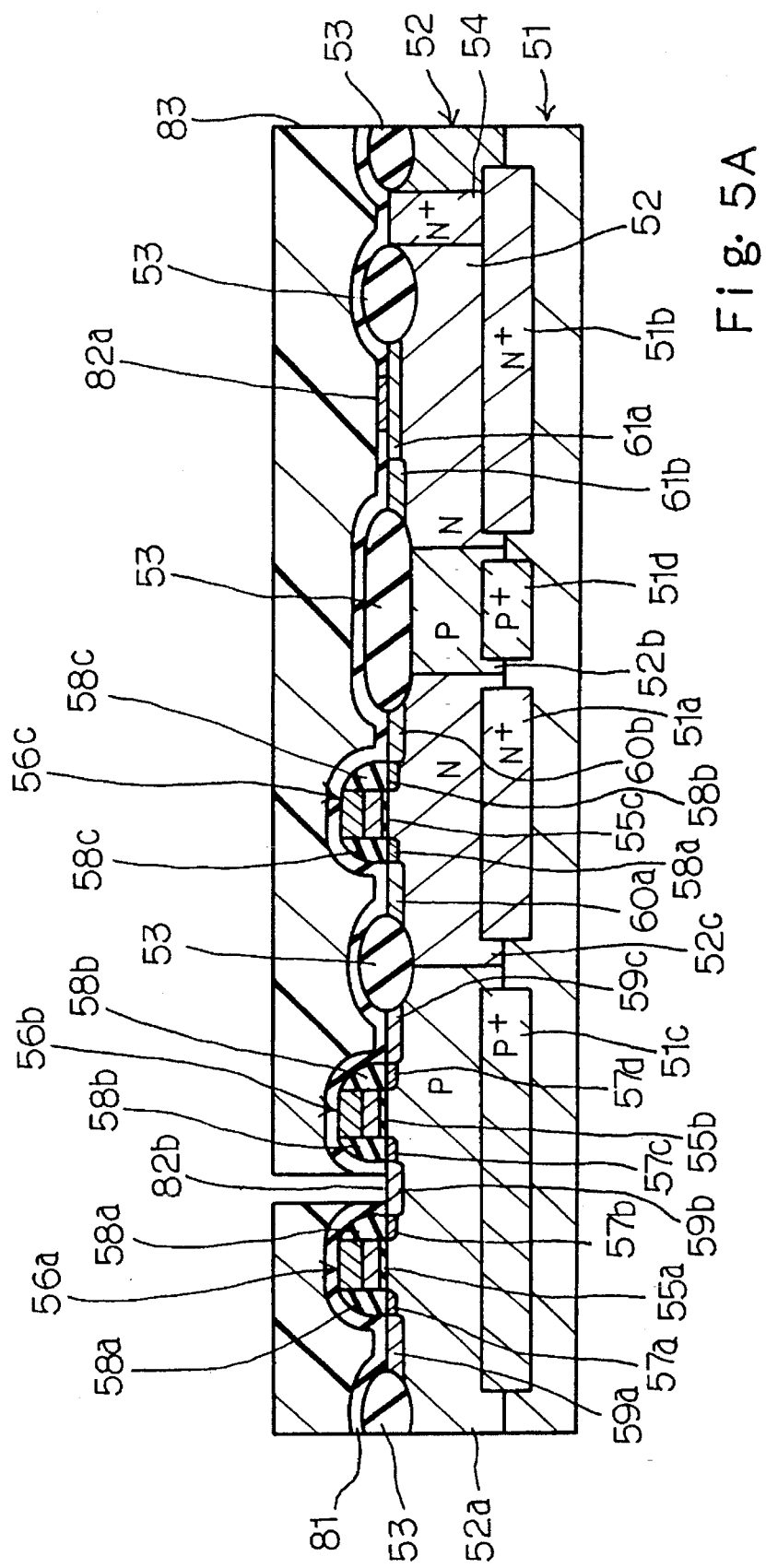
FIGS. 5A to 5C are cross sectional views showing another process sequence according to the present invention.

Another mask 83 is provided on the silicon oxide layer 81, and is patterned to expose another part of the silicon oxide layer 81 over the heavily-doped n-type source/drain region 59b. The silicon oxide layer 81 is anisotropically etched away so as to form a ground contact hole 82b as shown in FIG. 5A.

The mask 83 is stripped off, and a silicide layer is deposited over the entire surface of the structure. N-type dopant impurity such as phosphorus and/or arsenic is introduced into the silicide layer. The ground voltage line 84 and the emitter electrode 85 may be doped with arsenic and/or phosphorus and only the arsenic, respectively, by using appropriate masks.

Figure 5B:
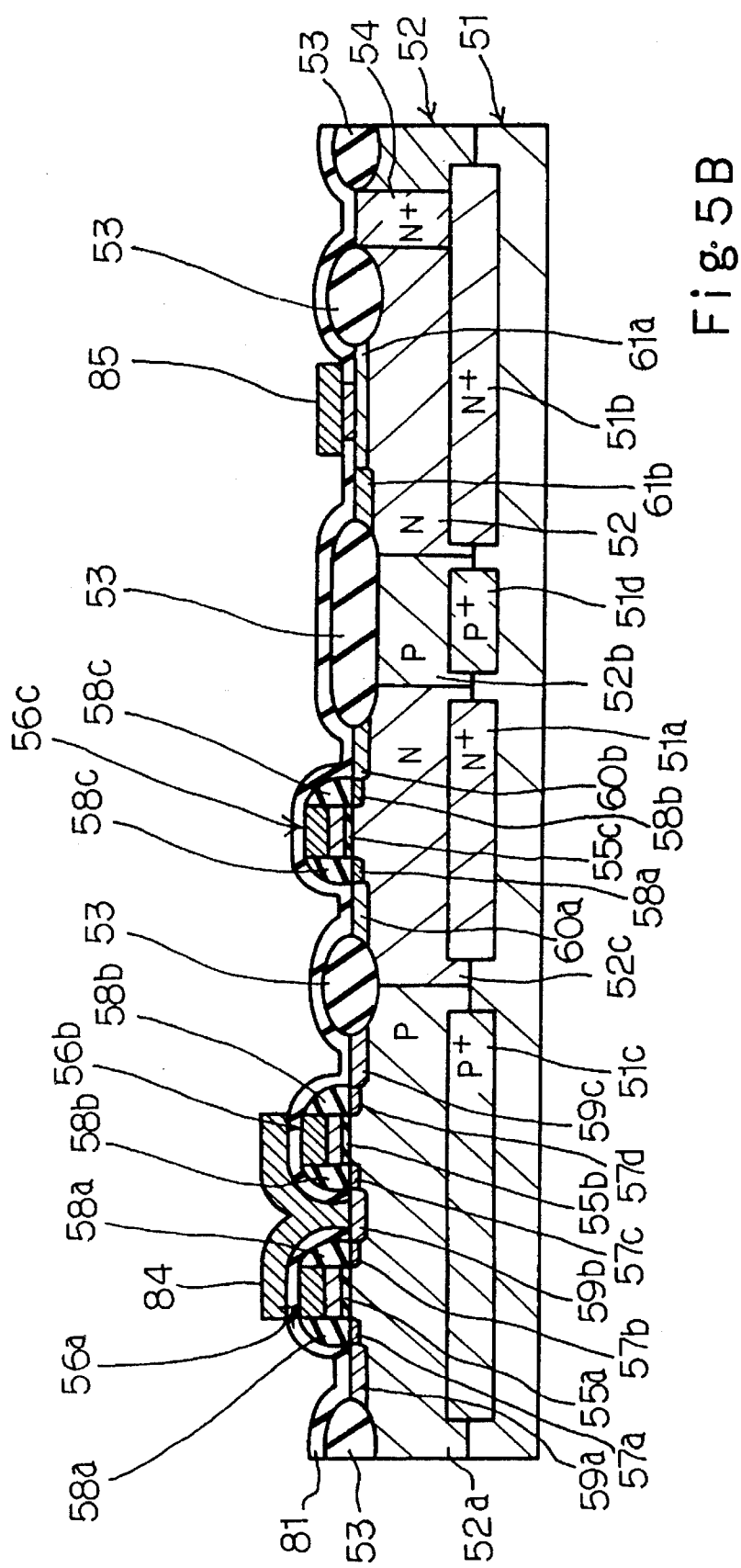
Figure 5C:
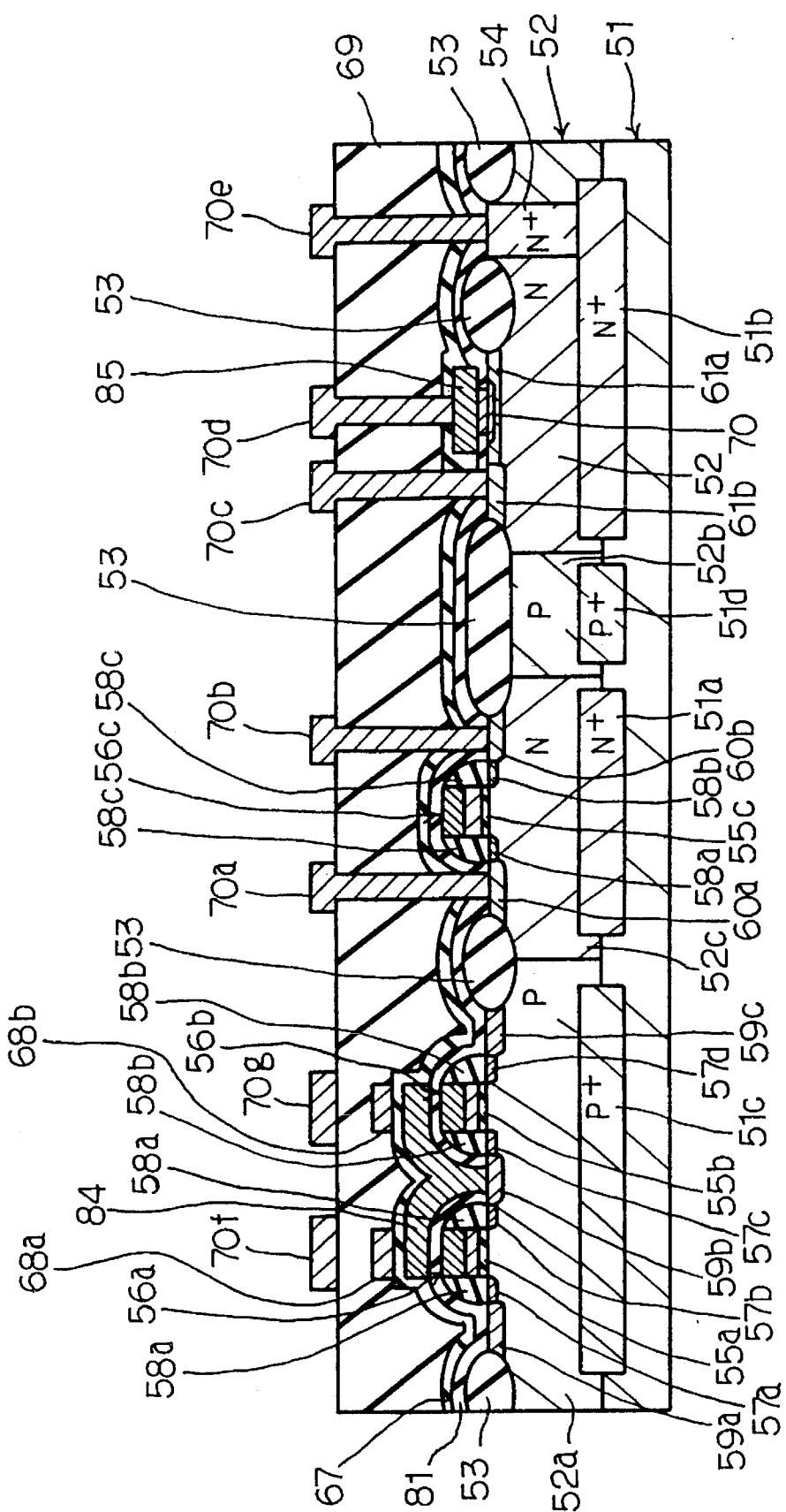

An appropriate mask is provided on the silicide layer, and is anisotropically etched away for simultaneously forming a ground voltage line 84 and an emitter electrode 85. The mask is removed from the structure, and the resultant structure is illustrated in FIG. 5B.

After the formation of the ground voltage line 84 and the emitter electrode 85, the process sequence implementing the second embodiment returns to the later stages of the process sequence implementing the first embodiment. For this reason, layers are labeled with the same references as those designating the corresponding layers formed through the process sequence implementing the first embodiment.

The integrated circuit device thus fabricated through the process sequence may be a bi-CMOS implementation of a static random access memory device. The process sequence implementing the second embodiment achieves all the advantages of the first embodiment except for the simultaneous formation of the ground voltage line/emitter electrode. Moreover, the ground voltage line 84 of silicide is held in contact with the heavily-doped n-type source/drain region 59b without a doped polysilicon film, and the heavily-doped n-type source/drain region 59b is single crystalline silicon less resistive rather than the polysilicon. For this reason, the ground contact is smaller in resistance against current flowing into the ground voltage line 84 rather than the ground contact between the doped polysilicon film 64a and the ground voltage line 65.

As will be appreciated from the foregoing description.

Although particular embodiments of the present invention have been shown and described, it will be obvious to those skilled in the art that various changes and modifications may be made without departing from the spirit and scope of the present invention. For example, the present invention is applicable to a process sequence for fabricating any kind of integrated circuit device having patterned silicide strips held in contact with silicon layer through contact holes.

What is claimed is:

1. A process of fabricating an integrated circuit device, comprising the steps of:

a) preparing a semiconductor substrate structure;

b) forming at least one first active area of a first conductivity type and at least second and third active areas of a second conductivity type opposite to said first conductivity type in a surface portion of said semiconductor substrate structure;

c) forming at least one first field effect transistor of a first channel conductivity type, at least one second field effect transistor of a second channel conductivity type opposite to said first channel conductivity type and collector and base regions of at least one bipolar transistor in said first active area, said second active area and said third active area, respectively;

d) covering said first field effect transistor, said second field effect transistor and said collector and base regions with an insulating layer;

e) forming a first contact hole exposing a part of said base region in said insulating layer;

f) growing a first conductive layer of a substance on said part of said base region for filling said first contact hole without a residue of said substance left on said insulating layer, and having the sub-steps of f-1) placing the resultant structure of said step e) in a reaction chamber, f-2) introducing reactant gases for producing said substance, an etching gas being further introduced into said reaction chamber for restricting a growth of said substance except for a growth on said part of said base region, f-3) introducing said etching gas into said reaction chamber for removing said substance left on said insulating layer, and f-4) repeating said sub-steps of f-2) and f-3) until said first conductive layer fills said first contact hole;

g) depositing a silicide layer on the entire surface of the structure of said step f);

h) forming a second conductive layer from said silicide layer, said second conductive layer being held in contact with said first conductive layer for serving as an emitter electrode; and i) completing said integrated circuit device, and having a sub-step of diffusing a dopant impurity from said first conductive layer into said part of said base region for forming an emitter region of said bipolar transistor.

2. The process as set forth in claim 1, in which a second contact hole exposing a source/drain region of said at least one first field effect transistor is simultaneously formed in said insulating layer in said step e), said substance being grown on said source/drain region for forming a third conductive layer by using selective polysilicon deposition in said second contact hole in said step f), and a fourth conductive layer is formed from said silicide layer in said step h), said fourth conductive layer being held in contact with said third conductive layer.

3. The process as set forth in claim 1, in which said substance is doped polysilicon.

4. The process as set forth in claim 1, in which said substance is non-doped polysilicon, a dopant impurity being introduced into said non-doped polysilicon after said growth thereof.

* * * * *